United States Patent
Boerstler et al.

(10) Patent No.: US 7,430,264 B2
(45) Date of Patent: Sep. 30, 2008

(54) METHOD TO REDUCE TRANSIENT CURRENT SWINGS DURING MODE TRANSITIONS OF HIGH FREQUENCY/HIGH POWER CHIPS

(75) Inventors: David William Boerstler, Round Rock, TX (US); Eskinder Hailu, Austin, TX (US); Mack Wayne Riley, Austin, TX (US); Michael Fan Wang, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 593 days.

(21) Appl. No.: 10/981,154

(22) Filed: Nov. 4, 2004

(65) Prior Publication Data

US 2006/0093047 A1    May 4, 2006

(51) Int. Cl.
*H04L 7/00* (2006.01)
*H04L 25/00* (2006.01)
*H04L 25/40* (2006.01)
(52) U.S. Cl. .................. 375/375; 375/373; 375/376; 377/54; 377/73; 377/75; 377/78
(58) Field of Classification Search ......... 375/371–376; 377/54, 73, 75, 78
See application file for complete search history.

(56) References Cited

U.S. PATENT DOCUMENTS

| 4,654,851 | A | | 3/1987 | Busby | |
|---|---|---|---|---|---|
| 5,964,881 | A | * | 10/1999 | Thor | ........................ 713/501 |
| 6,700,421 | B1 | | 3/2004 | Mirov et al. | |
| 6,750,693 | B1 | | 6/2004 | Duewer | |
| 7,000,130 | B2 | * | 2/2006 | Adachi | ........................ 713/322 |
| 2005/0198550 | A1 | | 9/2005 | Ramsden | |
| 2006/0069929 | A1 | | 3/2006 | Boerstler et al. | |

* cited by examiner

*Primary Examiner*—Curtis Odom
(74) *Attorney, Agent, or Firm*—Stephen R. Tkacs; Stephen J. Walder, Jr.; D'Ann N. Rifai

(57) ABSTRACT

A method, an apparatus, and a computer program are provided to reduce transient current swings during mode transitions. Traditionally, transient supply voltage fluctuations on a chip account for a large portion of the power supply. The number of series inductances and resistances are typically minimized, while adding large decoupling capacitances between the supply voltage and ground. However, situations may arise where reduction of series inductances and resistances cannot be accomplished. Therefore, to assist in controlling the transient current swings, reduction of clocking frequencies are performed in a controlled manner.

10 Claims, 5 Drawing Sheets

METHOD TO REDUCE TRANSIENT CURRENT SWINGS DURING MODE TRANSITIONS OF HIGH FREQUENCY/HIGH POWER CHIPS

FIELD OF THE INVENTION

The present invention relates generally to power conservation and, more particularly, to reducing transient current swings during transitions in high frequency systems.

DESCRIPTION OF THE RELATED ART

As the operating frequency of micro-processors has increased, the resulting power dissipation has become a major bottle-neck in implementing large high performance systems. As a result, the package and cooling cost necessary to deal with the large power dissipation is accounting for a larger portion of total chip cost. For low-power mobile systems, the battery life-time is directly related to the power dissipation of the chip. Therefore, it is sought to increase the shelf-life of batteries. One way this is achieved is by clock gating, wherein the clock input to non-active circuit blocks is reduced in frequency or disabled completely.

However, the process of scaling down the clock frequency introduces additional challenges. FIG. 1 displays a simplified diagram of an electronic system having a power supply source, a printed circuit board (PCB), package, and chip. Power supply is delivered at the PCB end. The chip would like to interact with a stable power supply that is not affected by transient current consumption. A stable power supply becomes critical as the operating power supply is reduced, since any transient supply voltage fluctuations at the chip can account for a large portion of the desired power supply. To reduce transient current induced power supply functions, one generally minimizes the series inductance and resistance, while adding a large decoupling capacitance between VDD and GND. Where dI/dt is very large, the transient supply voltage swing caused by the series inductance can become very large. Hence, it is essential to reduce dI/dt when the chip is switched between various modes of operation.

Therefore, there is a need to reduce transient current in a manner that addresses at least some of the limitations of conventional power distribution networks.

SUMMARY OF THE INVENTION

The present invention provides a method, an apparatus, and a computer program for reducing transient current swings during mode transitions of high frequency/high power circuits. One manner to reduce transient current swings is to control clocking signals. In general, a high frequency clocking signals are provided to circuitry. Then, the frequency can be reduced over a plurality of pulses to control rate of change of current consumption from a power supply.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
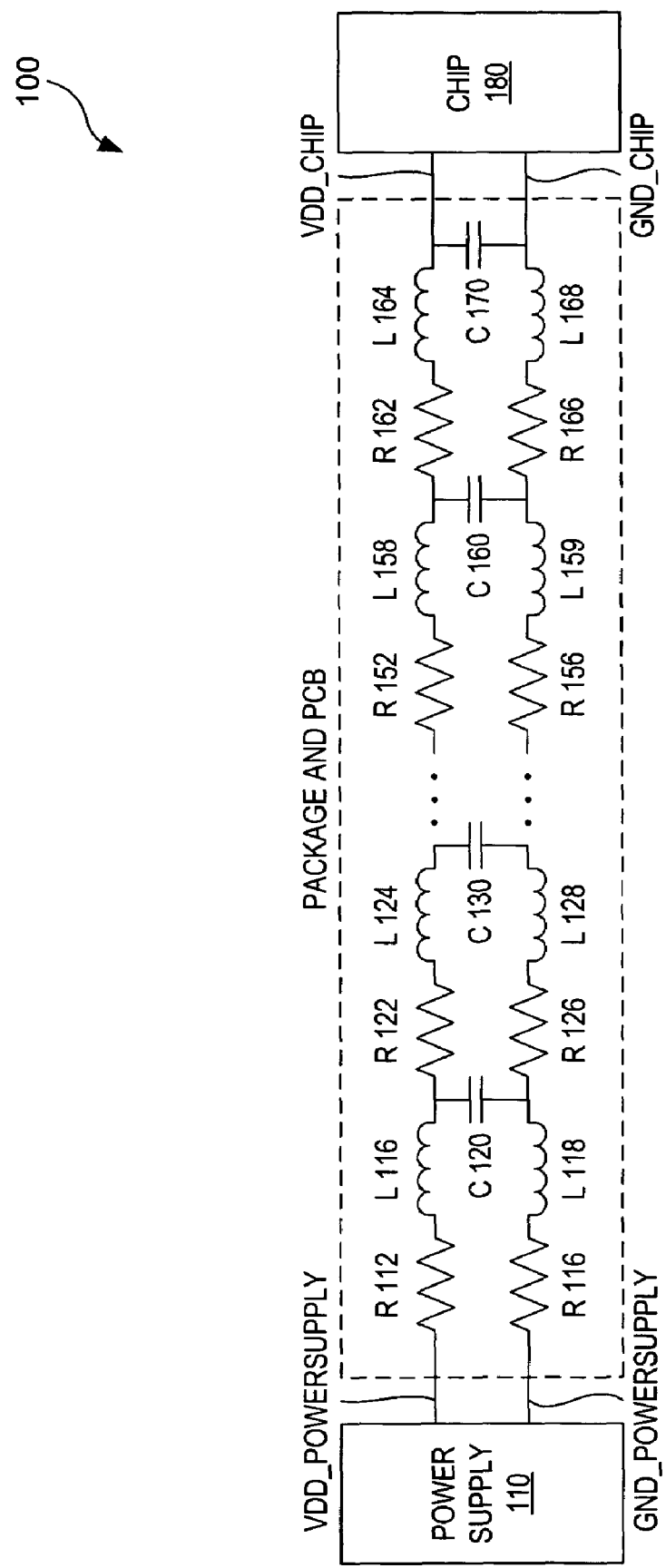
FIG. 1 schematically depicts a power supply source, package, printed circuit board (pcb), and chip in which, in part due to the parasitic series inductance and resistance present in the package and PCB, any transient current arising from the chip can result in transient voltage swing at VDD_CHIP and GND_CHIP.

Turning to FIG. 1, illustrated is a circuit 100 in which significant power surges can occur at the moment when an operating frequency of a chip 180 is changed. A power supply 110 is coupled to a resistor ("R") 112 and a R 116. The R 112 is coupled to an inductor ("L") 116, and the R 116 is coupled to an L 118. There is a capacitor ("C") 120 coupled between the L 116 and the L 118. The L 116 is coupled to an R 122, and the L 118 is coupled to an R 126.

The R 122 is coupled to L 124, and the R 126 is coupled to an L 128. There is a C 130 coupled between the L 124 and the L 128. The series of alternating resistors, inductors, and capacitors is repeated across the circuit, and is coupled to an R 152 and an R 156.

The R 152 is coupled to L 158, and the R 156 is coupled to an L 159. There is a C 160 coupled between the L 158 and the L 159. The L 158 is coupled to an R 162, and the L 159 is coupled to an R 166. The R 162 is coupled to an L 164, and the R 166 is coupled to an L 168. There is a C 170 coupled between the L 164 and the L 168. The chip 180 is coupled to the L 164 and the L 168. In FIG. 1, serious fluctuations can occur in the system 100 when the chip 180 changes from one clocking frequency to a second clocking frequency, thereby creating current surges within the various passive devices of FIG. 1.

Figure 2A:
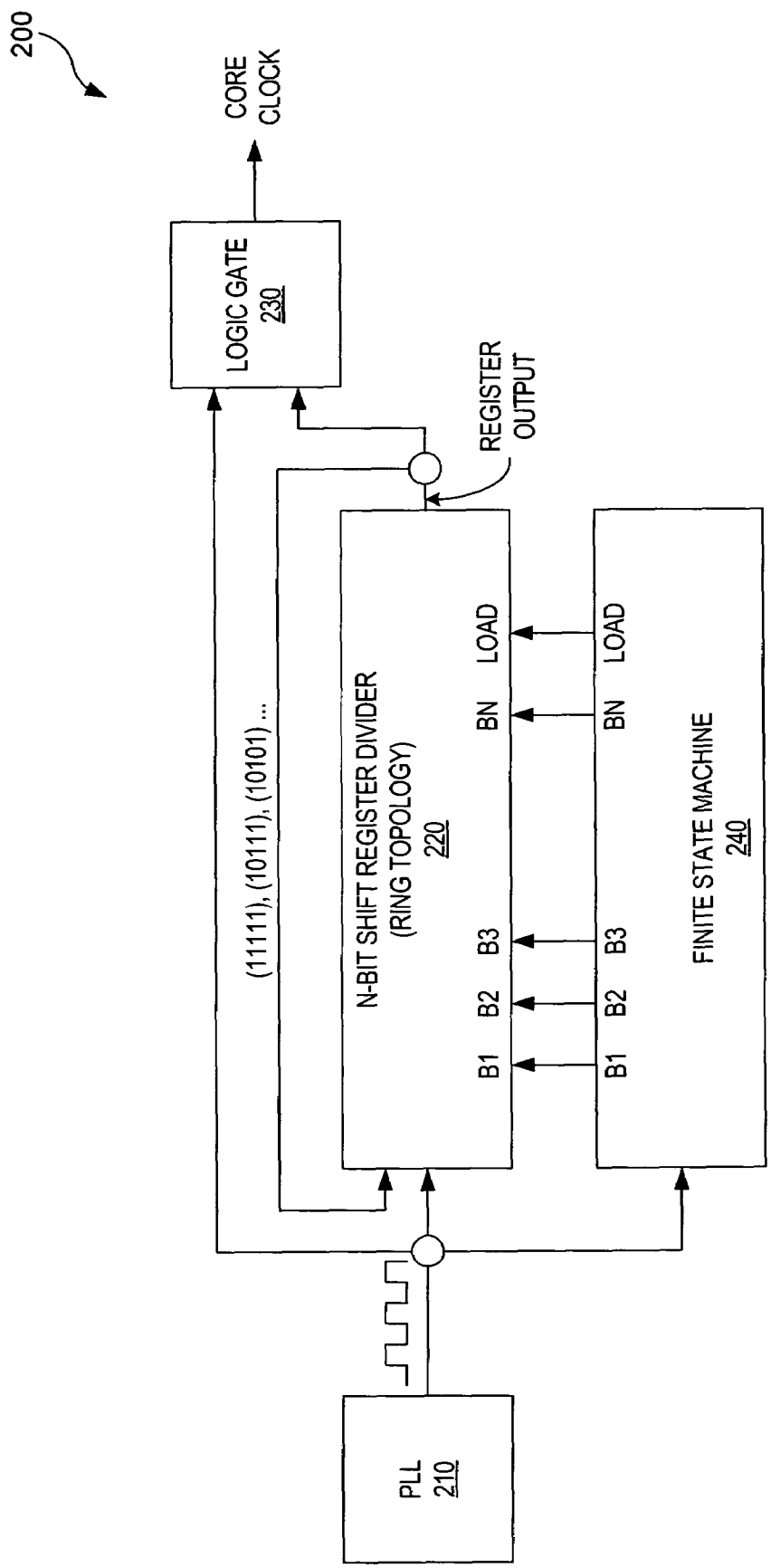
FIG. 2A schematically depicts a shift register for incrementally changing a clocking frequency.

Turning now to FIG. 2A, illustrated is a circuit 200 for reducing current spikes in the circuit 100, or other circuits. A phase locked loop (PLL) 210 or other clocking device is coupled to a finite state machine 240, an "n" bit shift register 220, and a logic gate 230. The finite state machine 240 has various outputs. These are the B1, B2, B3 up to BN outputs. Each output has a corresponding input in the divider 220. The machine 240 also has a load output, which is coupled to its corresponding input in the divider 220. The output of the divider 220 is coupled to a second input of the logic gate 230 and the input of the divider 220.

For slower frequencies, duty cycle preservation loses its criticality. In fact, in many applications, the maximum clock pulse width is limited to some fixed value. For example, in array and memory blocks, the duty cycle of a clock is intentionally reduced below 50% to prevent the undesired charge or discharge of critical nodes. The circuit 200 can be programmed to result in a desired dI/dt slope of a circuit, such as the circuit 100, thereby reducing transient voltage swings on the power supply. Because 50% duty cycle is not required for a number of applications, the divide operation, that is, the reduction of transferred clock pulses, can be provided by the shift register 220. Furthermore, the divider can be controlled either using hardware or software providing large flexibility in implementation.

Generally, the circuit 200 employs a PLL 210 or other high frequency signal source, a state machine 240 that may or may not be controlled by the PLL 210, an n-bit shift register divider 220, and a logic circuit 230 that takes in output from the shift register and from the PLL and outputs a desired core clock signal. The shift register 220 comprises a ring shift register or counter 220 that shifts its bits in a loop, controlled by PLL clock 210. The shift register 220 has cascaded level-sensitive master-slave type or edge sensitive type latches. In the shift register 220, the output of a latch is transferred to the output of subsequent latch every PLL clock period. The output of the last latch is coupled to the input of the first latch, transforming this cascade into a ring shift register.

In addition, the shift register 220 has parallel input bits, and a control signal called 'load'. When 'load' is asserted, the n parallel bits are loaded to the output of each latch of the shift register. Furthermore, while the load signal is asserted, the logic circuit 230 operates such that the PLL clock pulses are transmitted, on a 1:1 basis, to core clock. Alternatively, the logic circuit 230 can be designed such that, when load signal is asserted, core clock is at a predetermined high or low state.

In the circuit 200, the finite state machine 240 generates the n parallel input bits that are loaded into the shift register 220. These bits represent a "mask" value for whether or not the PLL clock pulse is to propagate to the core clock frequency. In one embodiment, the finite state machine 240 can be controlled by PLL 210 clock. For example, a counter in the finite state machine 240 can count the number of elapsed PLL 210 clock cycles prior to loading the next batch of bits into the shift register 220. In this manner, core clock output of the logic 230 can reside at some intermediate divide ratio for a specified number of cycles of PLL clock. An n-bit shift register has a capability of providing a full speed, that is, divide by 1, to a maximum of divide by "n" capability. The shift register 220 essentially operates by 'dropping off', or masking, selected pulses. For example, in an n-bit shift register configuration, a divide by n operation can take place by dropping n−1 bits out of every n-successive pulses from the PLL signal.

Figure 2B:
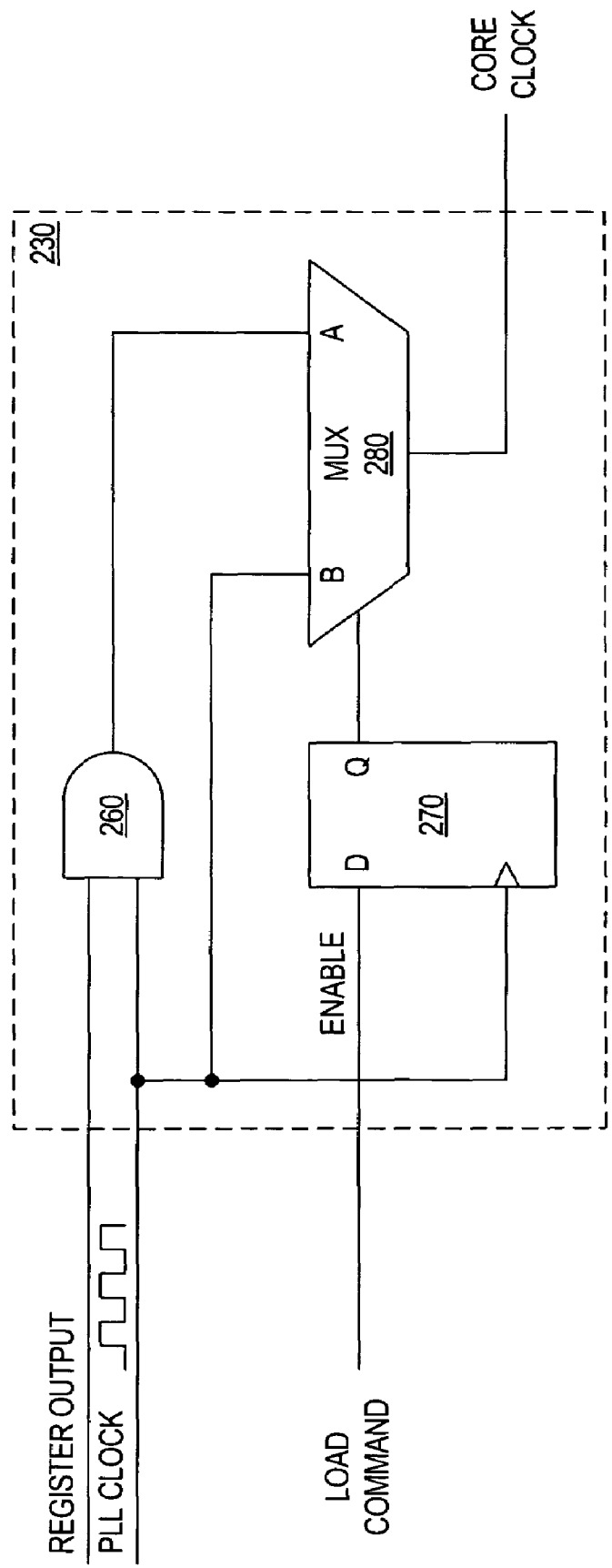
FIG. 2B schematically depicts a core clock logic gate.

Turning now to FIG. 2B, illustrated is one embodiment of the logic 230 illustrated in greater detail. Within the logic 230, if the load signal is asserted, the PLL 210 clock pulses are output as a core clock value. However, if they are not asserted, then the PLL 210 clock pulses are masked by whatever the register output is on the shift register 220.

In the circuit 230, a PLL 210 clock pulse and the mask value output of the divider 220 is input into an AND 260. The PLL 210 clock pulse is also input into the clocking input of a D flip flop 270. The load command is coupled into the data input of a D flip flop 270. The PLL 210 clock pulse is a first input into a Multiplexer (MUX) 280, and the output of the AND 260 is the second input into the MUX 280. The Q output of the latch 270 controls the selection by the MUX 280, and the selection becomes the core clock output.

Within the AND 260, the output of the divider 220 and the PLL 210 clock pulse are ANDed together. If the output of the divider 220 is a "1", then the positive clock pulse propagates to the MUX 280. However, if the output of the divider 220 is a "0", then the 0 value is generated by the AND 260, and a negative (that is, a zero value) clock pulse is generated by the AND 260.

In one embodiment, the circuit 230 can act as follows. If the load signal is not asserted, the input into a D latch 270 is "low", which means that the Q output is low. Therefore, the MUX 280 selects the AND 260 output "a" to be propagated as the core clock impulses. However, if the load command is "high", then the output of the D flip flop 270 is a "high", which means that the MUX 280 instead selects input "b" to propagate as a core clock frequency. Input "b" means that, during the load command, the original PLL clock frequency is propagating as the core clock frequency.

Figure 3:
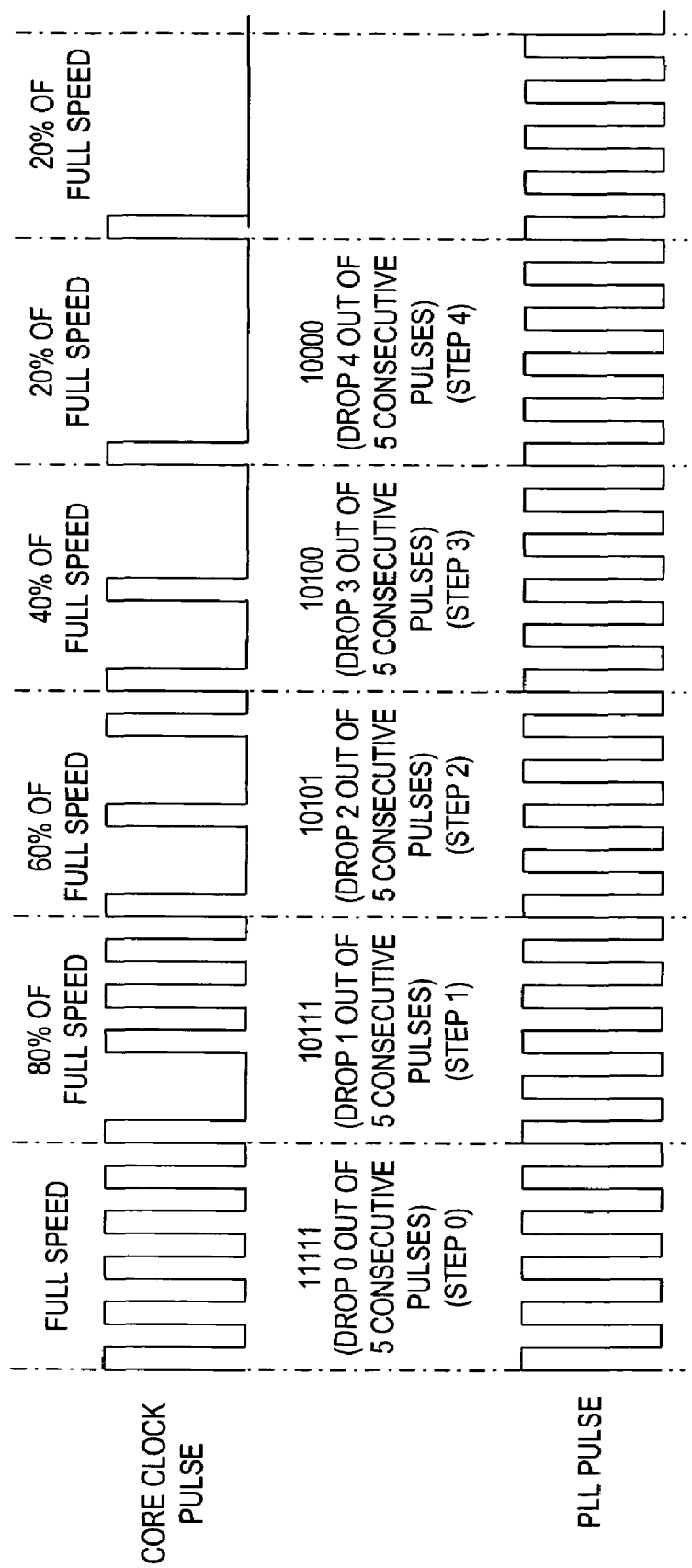
FIG. 3 illustrates the use of various bit values in a bit register leading to core clock pulses having decrementing duty cycles.

Turning now to FIG. 3, illustrated is a graph of the change of frequency. In this particular example, the divider 220 has 5 input bits. When the logic gate 230 is receiving the "load" signal, or the divider 220 is loaded entirely with the "1" values (11111), then, for every pulse of the PLL 210, there is a corresponding core clock pulse. Replacing each "1" with a "0" effectively reduces the output frequency by 20%. This means that the core clock has an effective frequency that is reduced in 20% increments.

In one embodiment, the finite state machine 240 is providing the necessary bits to go from full speed (divide by 1) to divide by 5.

The division is carried out in 4 steps. The bit sequences loaded into the shift register for each step are shown below:
Step 1. 10111 (drop 1 out of every 5 consecutive pulses)
Step 2. 10101 (drop 2 out of every 5 consecutive pulses)
Step 3. 10100 (drop 3 out of every 5 consecutive pulses)
Step 4. 10000 (drop 4 out of every 5 consecutive pulses)

After step 4, the frequency of core clock will be one fifth that of PLL clock.

In one embodiment, the divider 220 is kept at each step for 20 PLL clock cycles. Therefore, it takes a total of 80 clock cycles to go from full speed (divide by 1) to a divide by 5 modes. In this manner, the rate of change current consumption from power supply of FIG. 1 can be tightly controlled.

In a further embodiment, once a given frequency is generated by the logic gate 230 using masked PLL pulses, then a second source of core clock pulses can be used, which has the same effective frequency, but with a 50% duty cycle. For instance, once an effective frequency division by a factor of 5 is achieved using circuit 200, core clock can then switch to a different signal that has the same effective frequency but with a 50% duty cycle. Hence, circuit 200 provides the controlled frequency division capability while not guaranteeing 50% duty cycle output. Once the final effective frequency is arrived at, core clock can switch to a different signal that provides the same final effective frequency as circuit 200 but with a 50% duty cycle.

Figure 4:
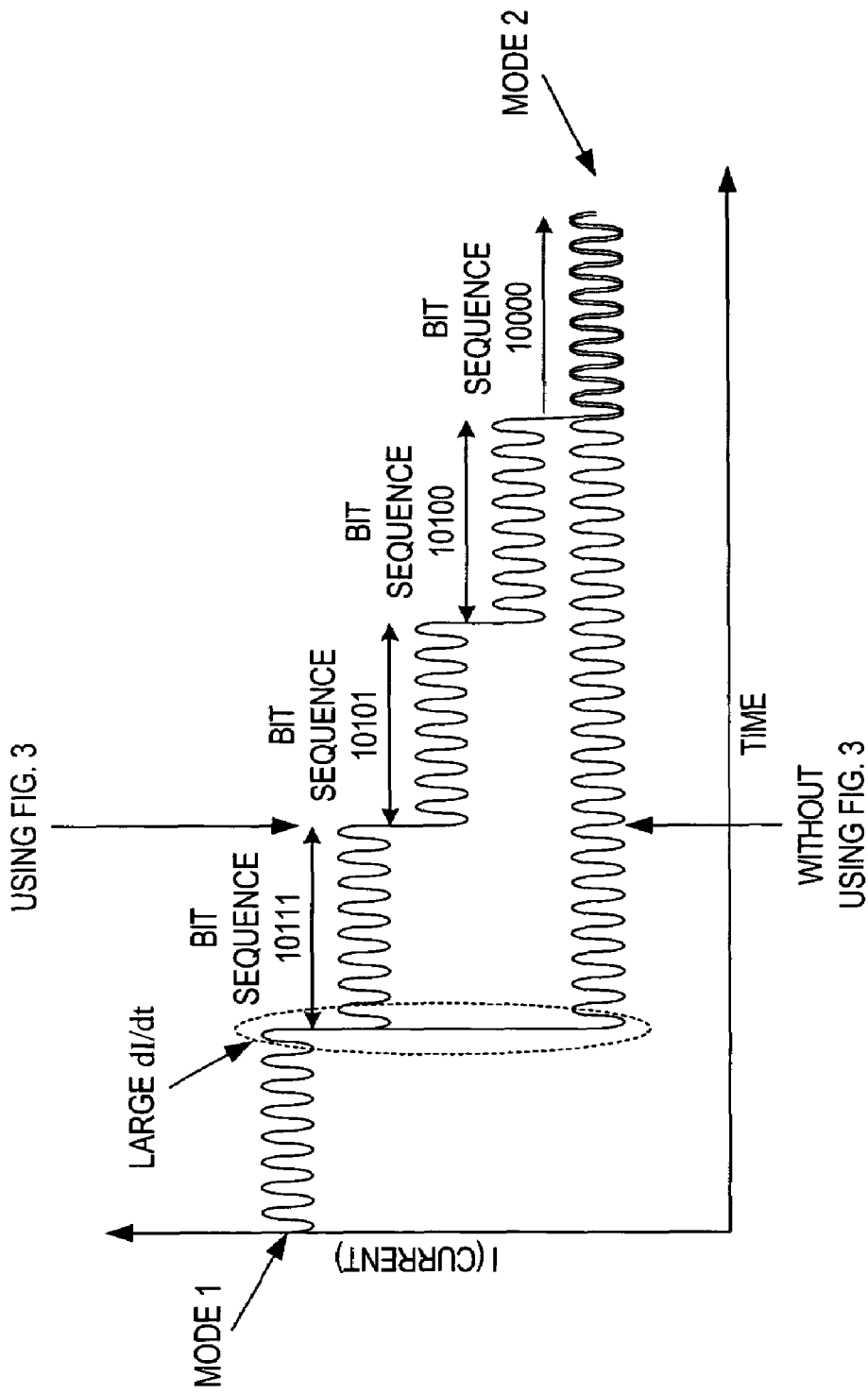
FIG. 4 illustrates a first waveform of current spikes without employment of the circuit of FIG. 2, and a second waveform of current spikes with employment of the circuit of FIG. 2.

Turning now to FIG. 4, illustrated are two different graphs illustrating current spikes in the circuit 100 both with and without employment of the circuit 200. In FIG. 3, there is a first mode (mode 1) and a second mode (mode 2). The first mode represents a faster processing speed for the chip 180, and the second mode represents a slower processing speed for the chip 180. Without employment of the circuit 200, as is illustrated, there is a comparatively large change in current spike in the transition from mode 1 to mode 2. However, with the use of the circuit 200, there are increments in current from mode 1 to mode 2, as the current is not at its minimum until later in time, therefore leading to smaller current spikes between transitions.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A method for reducing transient current swings during mode transitions of high frequency/high power circuits, comprising:
   providing a high frequency clocking signal; and
   reducing the frequency over a plurality of pulses to control rate of change of current consumption from a power supply, wherein reducing the frequency over a plurality of pulses comprises:
      generating, by a finite state machine, an n-bit shift register input and a load signal;
      receiving, by an n-bit ring shift register divider, the load signal and the n-bit shift register input;
      responsive to the load signal being asserted generating, by the n-bit ring shift register divider, a register output;
      receiving the load signal, the high frequency clocking signal, and the register output at a logic module;
      masking, by the logic module, the high frequency clocking signal according to the register output to generate a divided clock signal and
      selecting, by the logic module, between the high frequency clocking signal and the divided clock signal based on the load signal.

2. The method of claim 1, wherein reducing the frequency further comprises reducing the high frequency clocking signal over a plurality of stages.

3. The method of claim 2, wherein one stage of the plurality of stages comprises dropping at least one pulse out of a plurality of consecutive pulses.

4. The method of claim 2, wherein one stage of the plurality of stages comprises dropping more than one pulse out of a plurality of consecutive pulses.

5. The method of claim 1, further comprising shifting, by the n-bit ring shift register divider, bits in a loop controlled by the high frequency clocking signal.

6. The method of claim 1, wherein masking the high frequency clocking signal comprises:
   receiving, by a logic gate the register output of the n-bit ring shift register divider and the high frequency clocking signal; and
   performing a logic operation on the register output and the high frequency clocking signal to generate the divided clock signal.

7. The method of claim 6, wherein the logic operation is a logic AND operation.

8. The method of claim 6, wherein selecting between the high frequency clocking signal and the divided clock signal based on the load signal comprises:
   receiving, at selective logic, an output of the logic gate and an output of the high frequency signal source; and
   selecting, by the selective logic, between the high frequency clock signal and the divided clock signal.

9. The method of claim 6, wherein the selective logic is configured to select the high frequency clock signal when the load signal is not asserted.

10. The method of claim 6, wherein the selective logic is configured to select the divided clock signal when the load signal is asserted.

* * * * *